United States Patent [19]
Pine

[11] Patent Number: 4,901,432
[45] Date of Patent: Feb. 20, 1990

[54] APPARATUS FOR ACCURATELY POSITIONING COMPONENTS

[75] Inventor: Jerrold S. Pine, Boca Raton, Fla.

[73] Assignee: Motorola, Inc., Schaumburg, Ill.

[21] Appl. No.: 316,129

[22] Filed: Feb. 27, 1989

[51] Int. Cl.$^4$ ............................................. H05K 13/02
[52] U.S. Cl. ...................................... 29/759; 29/602.1; 198/467.1; 198/670; 198/722
[58] Field of Search ...................... 29/759, 602.1, 740; 198/467.1, 722, 657, 670, 671

[56] References Cited

U.S. PATENT DOCUMENTS

| | | | |
|---|---|---|---|
| 1,122,365 | 12/1914 | Burch | 198/467.1 X |
| 2,627,140 | 2/1953 | Marzolf | 198/467.1 X |
| 4,471,528 | 9/1984 | Miller | 198/467.1 X |

FOREIGN PATENT DOCUMENTS 48312 12/1983 Japan .................................. 198/467.1

Primary Examiner—Carl E. Hall
Attorney, Agent, or Firm—Vincent B. Ingrassia; Anthony J. Sarli, Jr.

[57] ABSTRACT

A hollow tube (3) supports a spring (5) coaxially positioned within the tube (3) and free to rotate within it. The tube (3) has a longitudinal slot (4) through which components (2) threaded onto the coils of the spring (5) hang down. A motor 6 rotates the spring (5) causing the components, constrained by the slot (4), to move longitudinally along the slot (4). When they reach the end of the slot (4), they are orientated by the end of the spring (5), which has been suitably shaped, to the correct orientation to be presented for automatic mounting on a printed circuit board.

7 Claims, 2 Drawing Sheets

APPARATUS FOR ACCURATELY POSITIONING COMPONENTS

This invention relates generally to automatic mounting techniques for components and more especially to an apparatus and method for accurately positioning components. More particularly, though not exclusively, this invention relates to an apparatus and method for accurately positioning, components such as air-wound coils in a precise orientation for mounting on, for example, printed circuit boards.

Air-wound coils are used as inductors in electrical circuits and come in a variety of different sizes, varying both in diameter and in the number of coils. Their geometric configuration, however, has made them very difficult to present them in precise orientations by pick-and-place or robotic equipment for automatic mounting on printed circuit boards (p.c.b.'s) or the like. Traditionally, vibratory bowl feeders have been used to present air-wound coils for automatic placement and these feeders are effective when the coils are large in diameter and have many turns. However, even these feeders are disadvantageous since a separate feeder is required for each size coil. Since there are over ninety different size coils this results in a requirement for a large number of feeders.

For many products, however, small one, two or three turn coils are required. These coils become entangled in vibratory feeders and therefore have hitherto been manually placed in position because no effective means of automatically (robotically) picking them up and orientating them has been developed.

Accordingly, there is a need for an apparatus and a method for accurately positioning components which will enable various sizes of components to be quickly and easily presented in their correct orientation for mounting.

Therefore, according to one aspect, the present invention provides apparatus for presenting components in a predetermined orientation, comprising a hollow cylindrical member having a longitudinal slot therein; a helical member substantially coaxially positioned within said cylindrical member; and motor means for rotating said helical member to thereby move along said longitudinal slot components which are, in use, slidably mounted on said helical member so as to extend into said longitudinal slot whereby said components are presented at an end of said longitudinal slot in said predetermined orientation.

According to a second aspect of the invention, there is provided a method of presenting components in a predetermined orientation, comprising the steps of selecting one of a plurality of cartridges each comprising a hollow cylindrical member having a longitudinal slot therein and a helical member substantially coaxially positioned within said cylindrical member and having said components slidably mounted thereon so as to extend into said longitudinal slot; rotating said helical member of said selected cartridge so as to move said components along said longitudinal slot to an end thereof; and positioning said end of said longitudinal slot so as to present a component arriving at said end in the predetermined orientation.

One embodiment of the present invention will now be described more fully, by way of example only, with reference to the drawings of which:

Figure 1:
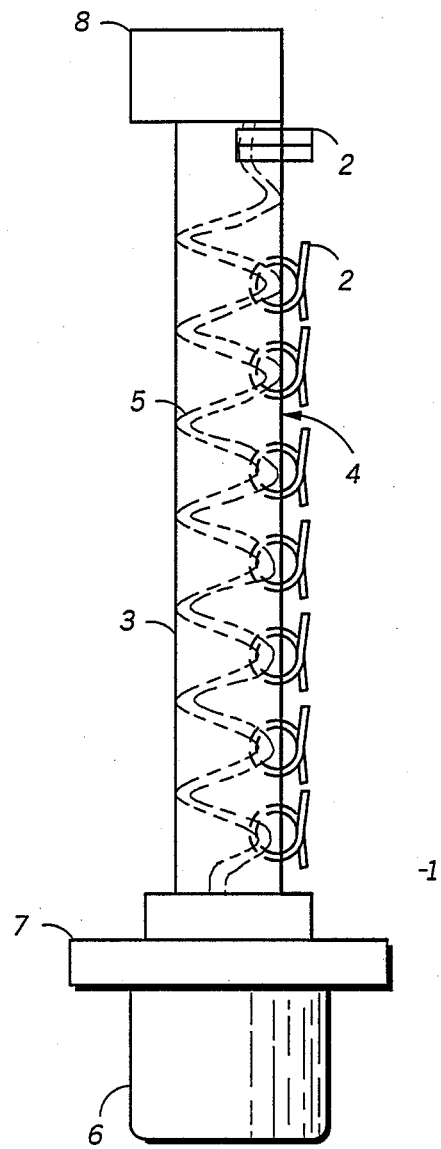
FIG. 1 shows, in schematic form, a device according to the invention for presenting components in a predetermined orientation.

Thus, there is shown in FIG. 1, a device 1 for feeding and presenting components in a predetermined orientation. The components, as shown, are small air-wound coils 2 which are used, for example, as inductors in electronic circuits. They are not shown to scale in this drawing. The device consists of a tube 3 which has a slot 4 running longitudinally along it. Coaxially within the tube 3 is positioned a helical member 5. This helical member 5 takes the form of a spring but need not be particularly "springy". The air-wound coils 2 are threaded onto the coils of the spring 5 such that they hang down within the slot 4. One end of the spring 5 is connected to a motor drive 6 which is of a stepper motor type. The motor drive housing is coupled to the tube 3 via a mounting plate 7 which is used for mounting the device 1 on a positioning apparatus to be described below. The stepper motor 6 rotates the spring through 360° at a time, thus causing each air-wound coil 2 to be moved along the slot 4 by one turn of the spring. The end of the spring opposite to the motor 6 is bent through 90° so that as the air-wound coil reaches the end, it is itself rotated so as to present the component in a proper orientation for mounting on, for example, a printed circuit board. It will, of course, be appreciated that this end of the spring can be bent to provide whatever orientation is desired for the component used. This end of the tube 3 is enclosed within an annular mounting element 8 used, in conjunction with mounting plate 7, for mounting on the positioning apparatus.

Although this device is shown in FIG. 1 with a relatively large diameter tube and spring in comparison to its length, it will be appreciated that much longer tubes and springs may be used giving the capability of holding larger numbers of components. For example, a 10 inch long brass tube with a diameter of 9/32 inch and having a ⅛ inch slot therein can support a spring having 10 turns per inch. These dimensions allow approximately 100 air-wound coils to be mounted thereon. The vibrations of the pulsing motor and gravity position the coils with their legs down through the slot in the correct orientation. This device could be used in several different ways. Firstly, a preloaded cartridge could be placed on a robot arm as an end effector and disperse its 100 components and then be replaced by a fresh cartridge when it has exhausted its components. Secondly, an empty cartridge can pick up coils, using the bent end, from an inline feeder or bowl feeder, by reversing the rotation of the motor, and then place the coils in the way described above. Clearly, although the invention has been described as positioning air-wound coils, other similar components can be positioned using the same device.

Figure 2:
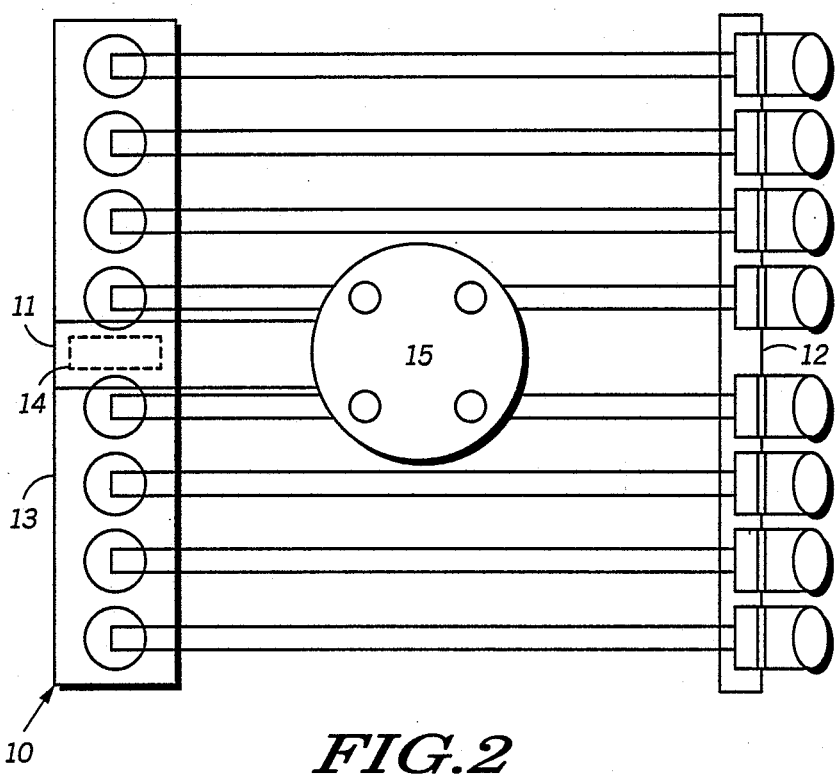
FIG. 2 is a plan view of an apparatus for utilizing a plurality of the devices of FIG. 1.
Figure 3:
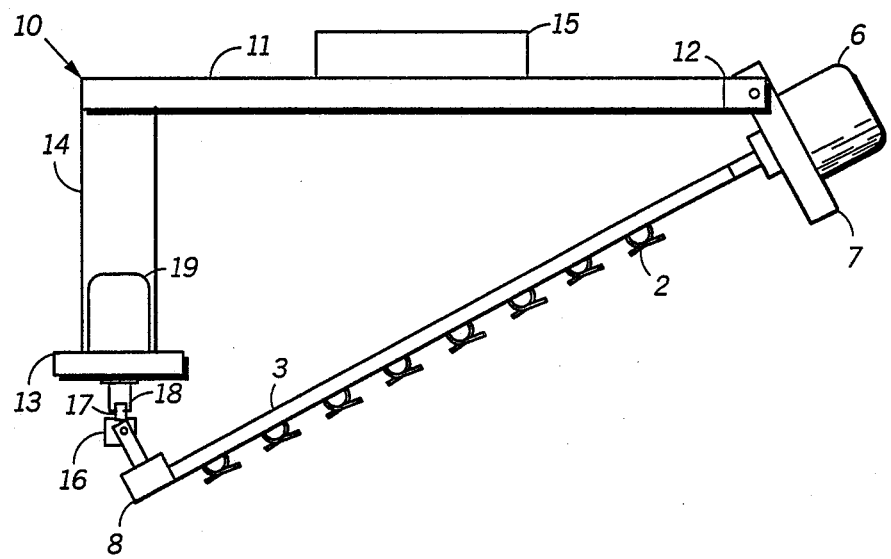
FIG. 3 is a side view of the apparatus of FIG. 2.

Furthermore, by using a positioning apparatus as shown in FIGS. 2 and 3, it is possible to position different components in turn without changing the cartridges. The apparatus shown in these figures comprises a frame 10 having a central longitudinal member 11 with a lateral cross-member 12 at one end thereof. The other end of the longitudinal member 11 also has a lateral cross-member 13 parallel to the cross-member 12 but spaced from the member 11 by a spacer member 14. This frame 10 also includes a plate 15 for mounting the frame onto a robotic arm (not shown). A plurality of cartridges such as the device 1 of FIG. 1, are then mounted on the frame 10. In this embodiment eight such cartridges are shown but of course the frame could be made in differing sizes to hold differing numbers of cartridges. It will be appreciated that depending on the requirements, each cartridge could have the same components, such as the air-wound coils 2 shown, or various cartridges could have different components which the robot arm could position as required.

Each cartridge is mounted on the frame 10 by means of mounting plate 7 hinged to the lateral cross-member 12 and the mounting element 8 being coupled to the lateral cross-member 13 such that the cartridge is diagonally downwardly positioned with its end for dispensing the components lowermost. The coupling between the mounting element 8 and the cross-member 13 includes a motorized hinge 16 coupled via coupling members 17 and 18 to a motor 19. This allows the robot to accurately position the end of the cartridge in an exact position for the end component to be presented in the desired orientation for mounting.

Thus there has been described a device for feeding and presenting components in a precise orientation for mounting on printed circuit boards.

I claim:

1. Apparatus for presenting components in a predetermined orientation, comprising:
   a hollow cylindrical member having a longitudinal slot therein;
   a helical member substantially coaxially positioned within said cylindrical member; and
   motor means for rotating said helical member to thereby move along said longitudinal slot components which are, in use, slidably mounted on said helical member so as to extend into said longitudinal slot whereby said components are presented at an end of said longitudinal slot in said predetermined orientation.

2. Apparatus according to claim 1 wherein said helical member includes a first end coupled to said motor means and a second end for presenting said components in said predetermined orientation.

3. Apparatus according to claim 1 wherein each of said components has at least one aperture therethrough via which the component may be threaded onto the coils of the helical member so as to extend into said longitudinal slot.

4. Apparatus according to claim 1 wherein said helical member comprises a spring.

5. Apparatus for presenting components in a predetermined orientation comprising a frame for holding a plurality of cartridges, each cartridge comprising:
   a hollow cylindrical member having a longitudinal slot therein; and
   a helical member substantially coaxially positioned within said cylindrical member and having, in use, components slidably mounted thereon so as to extend into said longitudinal slot;
   there further being provided means for positioning each cartridge in turn in such a way as to present a component mounted on an end of said helical member in said predetermined orientation, and means for rotating said helical member so as to move components slidably mounted thereon to said end thereof.

6. Apparatus according to claim 5 wherein each cartridge incorporates said means for rotating said helical member.

7. Apparatus according to claim 5 wherein said means for rotating said helical member is positioned on said frame and includes means for coupling to the helical member of a predetermined cartridge.

* * * * *